United States Patent
Kanrei

(10) Patent No.: US 10,930,744 B2
(45) Date of Patent: Feb. 23, 2021

(54) SEMICONDUCTOR DEVICE

(71) Applicants: KABUSHIKI KAISHA TOSHIBA, Minato-ku (JP); TOSHIBA MEMORY CORPORATION, Minato-ku (JP)

(72) Inventor: Nobuki Kanrei, Yokohama (JP)

(73) Assignees: KABUSHIKI KAISHA TOSHIBA, Minato-ku (JP); TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 16/357,969

(22) Filed: Mar. 19, 2019

(65) Prior Publication Data
US 2020/0098873 A1    Mar. 26, 2020

(30) Foreign Application Priority Data
Sep. 20, 2018 (JP) .............................. JP2018-175674

(51) Int. Cl.
*H01L 29/24* (2006.01)
*H01L 29/786* (2006.01)

(52) U.S. Cl.
CPC ............ *H01L 29/24* (2013.01); *H01L 29/247* (2013.01); *H01L 29/7869* (2013.01); *H01L 29/78693* (2013.01)

(58) Field of Classification Search
CPC .... H01L 29/24; H01L 29/247; H01L 29/7869
See application file for complete search history.

(56) References Cited

U.S. PATENT DOCUMENTS

| 8,029,941 B2* | 10/2011 | Zenitani | G01N 27/4074 429/479 |
| 2013/0134422 A1* | 5/2013 | Tsubuku | H01L 29/1033 257/57 |
| 2016/0118501 A1* | 4/2016 | Nabatame | H01L 29/66969 257/43 |
| 2016/0218223 A1 | 7/2016 | Nomura | |

FOREIGN PATENT DOCUMENTS

| JP | 63-171352 | 7/1988 |
| JP | 5168605 | 3/2013 |
| JP | 5735306 | 6/2015 |
| JP | 2015-144154 | 8/2015 |
| JP | 2018-505556 | 2/2018 |

OTHER PUBLICATIONS

Nomura, K., et al. "Ambipolar Oxide Thin-Film Transistor", Advanced Materials 23, 2011, 4 pages.

* cited by examiner

*Primary Examiner* — Dung A. Le
(74) *Attorney, Agent, or Firm* — Oblon, McClelland, Maier & Neustadt, L.L.P.

(57) ABSTRACT

According to one embodiment, a semiconductor device includes an oxide semiconductor layer, a first electrode, a second electrode, and a control electrode. The oxide semiconductor layer includes tin and tungsten. An average coordination number of oxygen atoms to tin atoms is greater than 3 but less than 4. The first electrode is electrically connected to a first end portion of the oxide semiconductor layer. The second electrode is electrically connected to a second end portion of the oxide semiconductor layer on a side opposite to the first end portion. The control electrode opposes a portion of the oxide semiconductor layer between the first end portion and the second end portion.

18 Claims, 8 Drawing Sheets

W: TUNGSTEN ATOM  O: OXYGEN ATOM

| SAMPLE | COMPOSITION (atomic%) | | | | COMPOSITION RATIO | |
|---|---|---|---|---|---|---|
| | Sn | O | W | Ar | O/Sn | W/Sn |
| SnWO | 46.0 | 50.1 | 3.3 | 0.58 | 1.09 | 0.072 |
| SnO | 47.5 | 52.0 | — | 0.50 | 1.09 | — |

FIG. 3

| SAMPLE | | A | B | C |
|---|---|---|---|---|
| O₂ RATIO | | 0 | 5% | 15% |
| COORDINATION NUMBER | Sn | 3.1 | 3.8 | 4.3 |
| | W | 6 | - | 6 |

SEMICONDUCTOR DEVICE

CROSS-REFERENCE TO RELATED APPLICATIONS

This application is based upon and claims the benefit of priority from Japanese Patent Application No. 2018-175674, filed on Sep. 20, 2018; the entire contents of which are incorporated herein by reference.

FIELD

Embodiments relate to a semiconductor device.

BACKGROUND

Many transistors that use an oxide semiconductor are of the n-channel type; and it is difficult to configure a CMOS circuit using one oxide semiconductor.

BRIEF DESCRIPTION OF THE DRAWINGS

FIG. 3 is a table comparing the composition of the oxide semiconductor according to the embodiment and the composition of an oxide semiconductor according to a comparative example;

DETAILED DESCRIPTION

Figure 1:
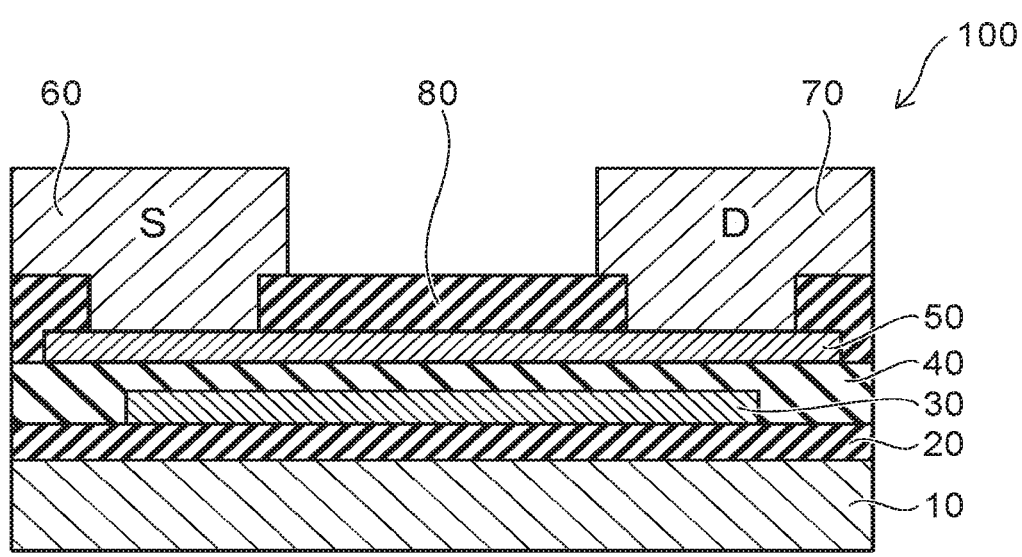
FIG. 1 is a schematic cross-sectional view illustrating a semiconductor device according to a first embodiment.

According to one embodiment, a semiconductor device includes an oxide semiconductor layer, a first electrode, a second electrode, and a control electrode. The oxide semiconductor layer includes tin and tungsten. An average coordination number of oxygen atoms to tin atoms is greater than 3 but less than 4. The first electrode is electrically connected to a first end portion of the oxide semiconductor layer. The second electrode is electrically connected to a second end portion of the oxide semiconductor layer on a side opposite to the first end portion. The control electrode opposes a portion of the oxide semiconductor layer between the first end portion and the second end portion.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view illustrating a semiconductor device 100 according to a first embodiment. The semiconductor device 100 is a bottom gate thin film transistor (Thin Film Transistor (TFT)).

As shown in FIG. 1, the semiconductor device 100 includes a substrate 10, an insulating film 20, a gate electrode 30, a gate insulating film 40, an oxide semiconductor layer 50, a source electrode 60, and a drain electrode 70.

The substrate 10 is, for example, a silicon substrate, a glass substrate, or a plastic substrate. The substrate 10 may be a substrate including a resin such as polyimide, etc. The insulating film 20 is provided on the substrate 10. The insulating film 20 includes at least one of silicon oxide ($SiO_x$) or silicon nitride ($SiN_x$). The thickness of the insulating film 20 is, for example, 100 nanometers (nm).

The gate electrode 30 is provided selectively on the insulating film 20. The gate electrode 30 includes, for example, at least one of tungsten (W), molybdenum (Mo), copper (Cu), Ta (tantalum), or aluminum (Al). The gate electrode 30 may include at least one of titanium nitride (TiN) or tantalum nitride (TaN). The gate electrode 30 may include an aluminum alloy having aluminum as a major component.

The thickness of the gate electrode 30 is, for example, not less than 10 nm and not more than 200 nm. The gate electrode 30 may have a tilted side surface. That is, the side surface of the gate electrode 30 may have a tapered configuration widening downward. The coverage of the gate insulating film 40 is increased by the tapered configuration of the gate electrode 30. The leakage current can be suppressed by increasing the coverage of the gate insulating film 40.

The gate insulating film 40 is provided on the insulating film 20 to cover the gate electrode 30. The gate insulating film 40 includes, for example, at least one of silicon oxide ($SiO_x$), aluminum oxide ($Al_xO_y$), silicon nitride ($SiN_x$), or silicon oxynitride ($SiO_xN_y$). The gate insulating film 40 may have a stacked structure including multiple films. The gate insulating film 40 includes, for example, at least two of silicon oxide, aluminum oxide, silicon nitride, or silicon oxynitride. The thickness of the gate insulating film 40 is, for example, not less than 10 nm and not more than 100 nm.

The oxide semiconductor layer 50 is provided selectively on the gate insulating film 40. A portion of the gate insulating film 40 is positioned between the gate electrode 30 and the oxide semiconductor layer 50. The thickness of the oxide semiconductor layer 50 is, for example, not less than 10 nm and not more than 100 nm. For example, the oxide semiconductor layer 50 functions as the channel layer of the TFT. The oxide semiconductor layer 50 is a ternary compound including tin (Sn), tungsten (W), and oxygen (O). The oxide semiconductor layer 50 is, for example, amorphous. Also, the oxide semiconductor layer 50 may be, for example, polycrystalline.

The ratio (W/Sn) of the content ratio of tungsten (W) in the oxide semiconductor layer 50 to the content ratio of tin (Sn) in the oxide semiconductor layer 50 is not less than 0.05 and not more than 0.3. In other words, the ratio (W/Sn) of the number of W atoms to the number of Sn atoms in the oxide semiconductor layer 50 is 0.05≤W/Sn≤0.3.

The source electrode 60 is electrically connected to one end of the oxide semiconductor layer 50. The source electrode 60 includes, for example, a metal film including at least one of molybdenum, titanium, tantalum, tungsten, or aluminum. The source electrode 60 may include at least one of molybdenum nitride (MoN), titanium nitride, or tantalum nitride. The source electrode 60 may have a stacked structure including multiple films. The source electrode 60 includes at least two of the conductive materials recited above. A conductive oxide semiconductor such as ITO (Indium Tin Oxide), etc., may be used as the source electrode 60.

The drain electrode 70 is electrically connected to another end of the oxide semiconductor layer 50. The same material as the source electrode 60 can be used as the drain electrode 70.

The semiconductor device 100 further includes a protective film 80. The protective film 80 is provided on the oxide semiconductor layer 50. The protective film 80 protects the oxide semiconductor layer 50. The protective film 80 includes, for example, at least one of silicon oxide, aluminum oxide, or silicon nitride.

For example, the protective film 80 is made using CVD using TEOS (Tetra Ethyl Ortho Silicate) as a source material. For example, the protective film 80 has a stacked structure including multiple films. The protective film 80 includes, for example, at least two of silicon oxide, aluminum oxide, or silicon nitride. The thickness of the protective film 80 is, for example, not less than 10 nm and not more than 200 nm.

The semiconductor device 100 may further include a not-illustrated overcoat film. For example, the overcoat film is provided on the source electrode 60, the drain electrode 70, and the protective film 80. The overcoat film is, for example, a protective film of the same material as the protective film 80.

The oxide semiconductor layer 50 according to the embodiment is an ambipolar semiconductor layer having conductivity of both electrons and holes. The oxide semiconductor layer 50 is ambipolar by including tin monoxide (SnO) and tungsten trioxide ($WO_3$). In the oxide semiconductor layer 50, the content ratio of tungsten trioxide is lower than the content ratio of tin monoxide.

For example, the oxide semiconductor layer 50 is formed using reactive sputtering. For example, the oxide semiconductor layer 50 is formed using a target made of a composite sintered body including tin monoxide (SnO) and tungsten trioxide ($WO_3$) in an atmosphere in which argon (Ar) gas and oxygen ($O_2$) gas are mixed. When forming the oxide semiconductor layer 50, the ratio of the flow rate of the Ar gas and the flow rate of the $O_2$ gas is appropriately set to provide the prescribed crystal structure.

For example, Patent Literature 1 discusses a method in which SnO is deposited on a substrate by sputtering. According to Patent Literature 1, an oxide semiconductor of SnO in which an ambipolar operation is possible can be obtained by controlling the partial pressure of oxygen when forming the film so that the divalent $Sn^{2+}$ ions included in the SnO are 90% or more. However, the oxidation state of Sn changes and is dependent on the ratio of the flow rate of the Ar gas and the flow rate of the $O_2$ gas. Also, generally, for an oxide of a main group metal element having a low melting point such as SnO, the heat resistance is low; and the crystallinity changes easily in heat treatment at a relatively low temperature. Due to such reasons, it is difficult to obtain a stable ambipolar operation when SnO is used as the channel layer of the TFT.

Conversely, the oxide semiconductor layer 50 according to the embodiment includes tin monoxide (SnO) and tungsten trioxide ($WO_3$). Thereby, not only is the ambipolar operation more stable than in the case of only SnO, but also the heat resistance can be improved. By setting the content ratio (W/Sn) of W to Sn in the oxide semiconductor layer 50 to a favorable value, the conductivity of both electrons and holes can be improved; and a high-temperature tolerance can be obtained. Also, the control of the film properties of the oxide semiconductor layer 50 is easy. By using the oxide semiconductor layer 50 as the channel layer of a TFT or the like, the stability of the transistor characteristics can be improved. Characteristics of the oxide semiconductor included in the oxide semiconductor layer 50 will now be described.

The ionic-bonding property of an oxide semiconductor is strong; and the conduction band is formed mainly of the s-orbitals and the p-orbitals of the metal. The valence band of the oxide semiconductor is formed mainly of the 2p-orbitals of oxygen. Generally, oxide semiconductors include a main group metal having a large principal quantum number; and the electron conductivity is high for a metal having a large principal quantum number because the s-orbitals are itinerant. On the other hand, the hole conductivity is exceedingly low for the 2p-orbitals of oxygen because the localization is strong. Accordingly, it is desirable for both electron and hole conductivities to be high to realize an oxide semiconductor having an ambipolar operation. Tin dioxide ($SnO_2$) and tin monoxide (SnO) are known as oxides of tin (Sn). In the case of $SnO_2$, Sn is tetravalent $Sn^{4+}$ ions; and the conduction band is formed of the 5s-orbitals of tin (hereinbelow, Sn5s) and the 5p-orbitals of tin (hereinbelow, Sn5p). On the other hand, the 2p-orbitals of oxygen (hereinbelow, O2p) is dominant in the valence band of $SnO_2$. Conversely, in the case of SnO, Sn is divalent $Sn^{2+}$ ions; and the Sn 5s-orbitals are formed at the top of the valence band. It is estimated that this is due to the covalent-bonding property of the bond between Sn and O being stronger than that of $SnO_2$. Thereby, in SnO, the localization of the valence band is eliminated; and hole conduction is possible. However, the Sn 5p-orbitals are the major orbitals in the conduction band of SnO; and the electron conductivity is therefore low.

Figure 2A:
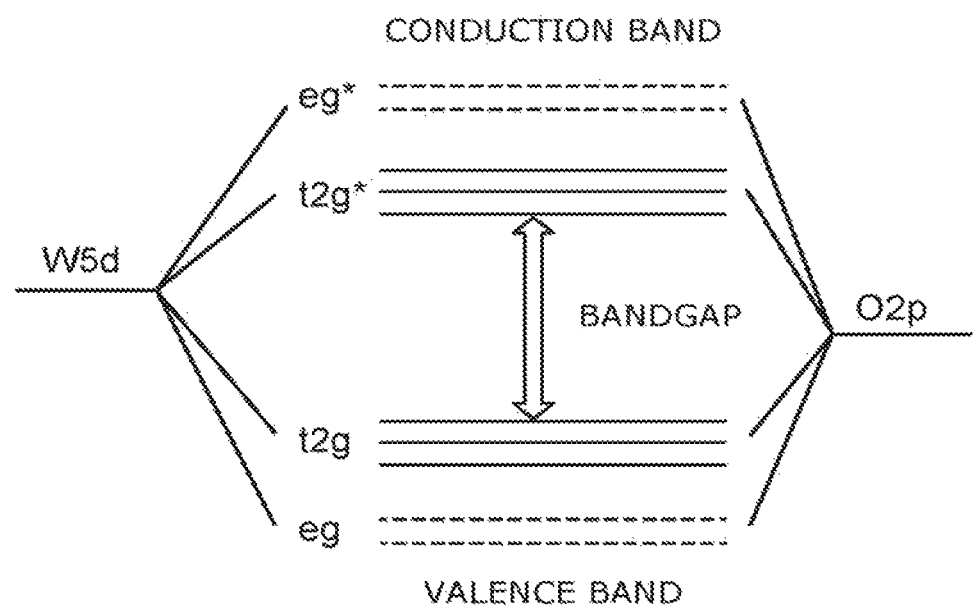
FIGS. 2A and 2B are schematic views showing the electronic state and the coordination structure of tungsten trioxide ($WO_3$)
Figure 2B:
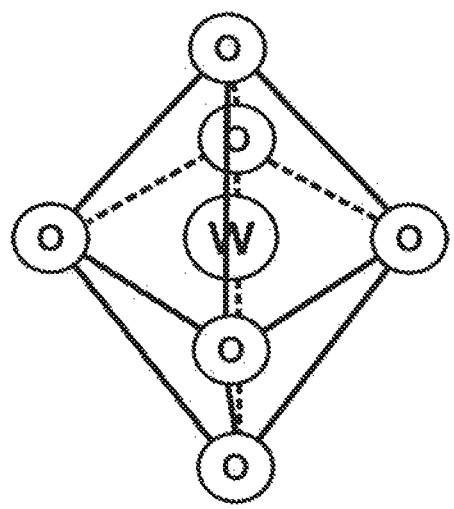

FIG. 2A is a schematic view showing the electronic state of tungsten trioxide ($WO_3$). FIG. 2B is a schematic view showing the octahedral W coordination structure of tungsten trioxide ($WO_3$). In $WO_3$, W is a hexavalent $W^{6+}$ ion. It is known that six oxygen atoms (hereinbelow, O atoms) coordinated around a W atom form an octahedral W cluster with the W atom at the center. $WO_3$ is an oxide of a transition metal; the W 5d-orbitals are split into triply-degenerate $t_{2g}$-orbitals and doubly-degenerate $e_g$-orbitals by ligand field splitting, and is hybridized with the 2p-orbitals of the coordinated oxygen. Generally, the split states (the energy difference) of the d-orbitals of the transition metal is largest in the case of an octahedral structure, and increases for elements having larger principal quanta. Therefore, in $WO_3$ as shown in FIG. 2A, distributed orbitals (electronic states) are formed in both the conduction band and the valence band. Also, there are expectations for a strong interaction because the energy level of the W 5d-orbitals is exceedingly near the energy levels of the Sn 5s-orbitals and the Sn 5p-orbitals.

Accordingly, the oxide semiconductor in which SnO and $WO_3$ are combined includes high density distributed orbitals (electronic states) in both the conduction band and the valence band. By forming the high density distributed orbitals (electronic states), more carriers can be transported with higher mobility. The oxide semiconductor that includes $WO_3$ also is advantageous from the perspective of heat resistance improvement because the melting point of $WO_3$ is high and is about 1470° C. Due to such reasons, in the oxide semiconductor layer 50 according to the embodiment, the conditions that are necessary for ambipolar operation are satisfied; and it is possible to increase both the electron and hole conductivities.

FIG. 3 is a table comparing the composition of the oxide semiconductor of SnWO according to the embodiment and the composition of an oxide semiconductor (tin monoxide (SnO)) according to a comparative example. FIG. 3 shows the composition (atomic % (atomic percent)) and the composition ratio. The oxide semiconductor layer 50 includes SnWO.

SnWO is formed on a silicon substrate using magnetron sputtering. The sputtering target is a SnWO sintered body including SnO (90 wt %) and $WO_3$ (10 wt %). The sputtering is performed without substrate heating in an Ar gas atmosphere. On the other hand, SnO also is formed on a silicon substrate by magnetron sputtering. The sputtering target is a sintered body of SnO (tin monoxide). The sputtering is performed without substrate heating in an Ar gas atmosphere.

Rutherford backscattering spectroscopy was used in the composition analysis of the samples. The analysis apparatus is the Pelletron 3SDH manufactured by National Electrostatics Corporation. The precision of the composition analysis of the apparatus is ±0.6 atomic % for Sn, ±0.1 atomic % for W, ±1.3 atomic % for O, and ±0.07 atomic % for Ar.

The composition of SnWO is Sn: 46 atomic %, W: 3.3 atomic %, O: 50.1 atomic %, and Ar: 0.58 atomic %. The ratio (W/Sn) of W to Sn in SnWO is 0.072; and the ratio (O/Sn) of O to Sn is 1.09.

The composition of SnO is Sn: 47.5 atomic %, O: 52 atomic %, and Ar: 0.5 atomic %. The ratio (O/Sn) of O to Sn in SnO is 1.09. In the comparison between SnWO and SnO, the proportions of Sn and O in SnWO tend to be lower than those of SnO. The ratio (O/Sn) of O to Sn is 1.09 for both.

Figure 4A:
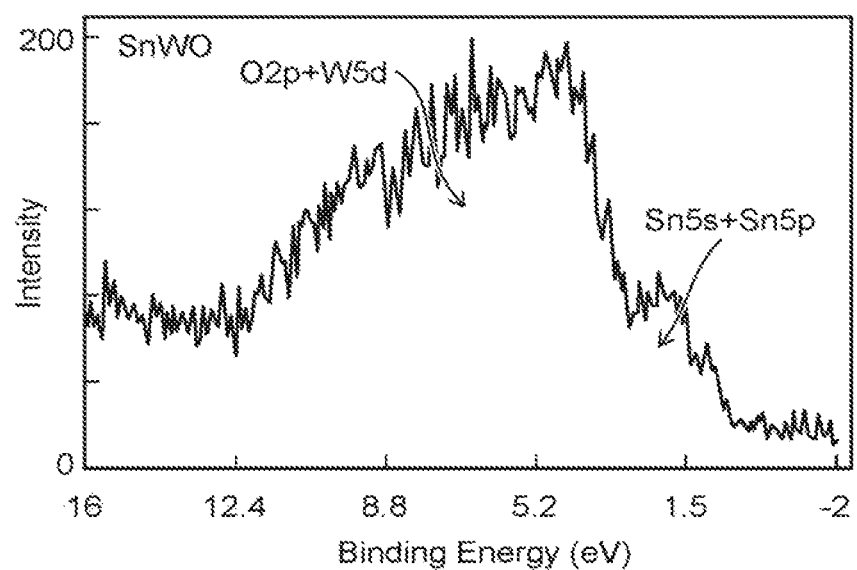
FIGS. 4A and 4B are graphs showing XPS (X-ray photoelectron spectroscopy) spectra of the oxide semiconductor according to the embodiment and the oxide semiconductor according to the comparative example.
Figure 4B:
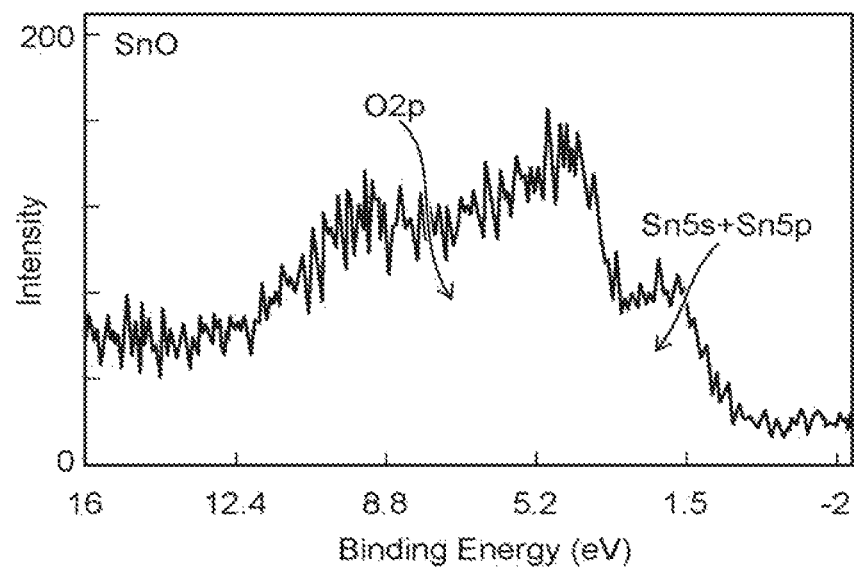

FIGS. 4A and 4B are graphs showing XPS (X-ray photoelectron spectroscopy) spectra of the oxide semiconductor of SnWO according to the embodiment and the oxide semiconductor of SnO according to the comparative example. FIG. 4A is a graph showing the results of the oxide semiconductor of SnWO according to the embodiment. FIG. 4B is a graph showing the results of the oxide semiconductor of SnO according to the comparative example. These figures show the electronic states at the valence band vicinity of the samples measured using X-ray photoelectron spectroscopy. The horizontal axis is the binding energy (units: eV). The vertical axis is the electron recovery amount. The measurement is performed under the conditions of an Almono X-ray source (1486.6 eV), a detection depth of about 8 nm, and a detection region of about 600 microns in diameter. The samples were the same as the samples analyzed in the Rutherford backscattering spectroscopy shown in FIG. 3.

As shown in FIGS. 4A and 4B, a high density spectrum exists at the 1 eV to 3.3 eV vicinity for both of the oxide semiconductors. These spectra are mainly due to the Sn 5s-orbitals; but a small number of the Sn 5p-orbitals also is included.

In SnWO, it is considered that the Sn 5s-orbitals that are highly itinerant are formed at the top of the valence band. Also, the spectral intensity at the 4 eV to 11 eV vicinity is higher for SnWO than for SnO. It is estimated that such a spectrum is due to the hybridization of the W 5d-orbitals and the O 2p-orbitals. Accordingly, the density of states of the valence band of SnWO is higher than that of SnO.

For example, the light absorption of a semiconductor is proportional to the binding density of states (the density of states coupled as a pair for the conduction band and the valence band contributing to the optical transition). Accordingly, it is possible to evaluate the density of states and/or the bandgaps of the valence band and the conduction band by optical analysis.

Generally, in a SnO crystal, a large bandgap due to the direct bandgap and a small bandgap due to the indirect bandgap coexist (referring to Non-Patent Literature 2). Such a band structure is a requirement for the ambipolar operation of SnO. Therefore, analysis of the complex dielectric functions was performed using spectroscopic ellipsometry (M-2000 manufactured by J. A. Woollam) to clarify the band structure and the electronic states of the oxide semiconductors.

Figure 5A:
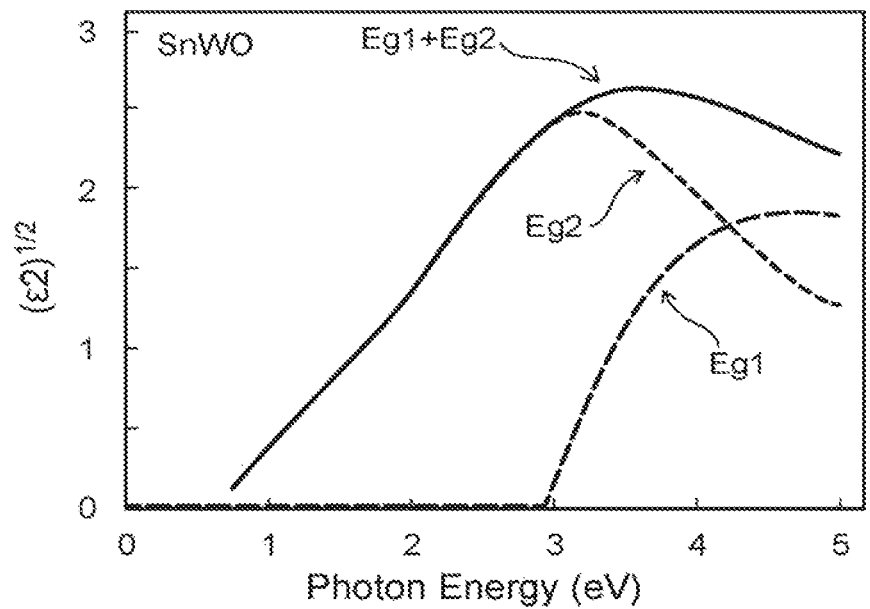
FIGS. 5A and 5B are graphs showing the complex dielectric function spectra of the oxide semiconductor according to the embodiment and the oxide semiconductor according to the comparative example.
Figure 5B:
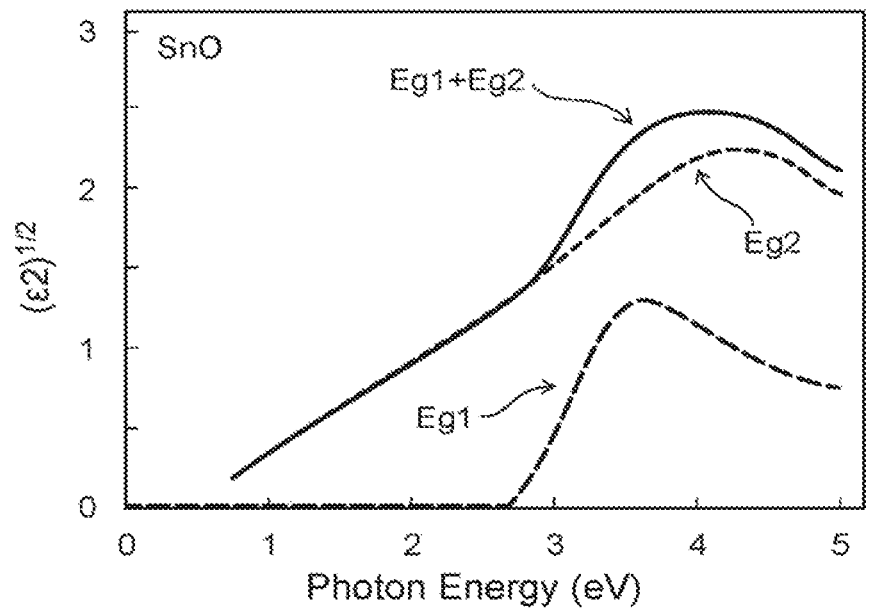

FIGS. 5A and 5B are graphs showing the complex dielectric function spectra of the oxide semiconductor of SnWO according to the embodiment and the oxide semiconductor of SnO according to the comparative example. FIG. 5A is a graph showing the complex dielectric function spectrum of the oxide semiconductor of SnWO according to the embodiment. FIG. 5B is a graph showing the complex dielectric function spectrum of the oxide semiconductor of SnO. The samples used in the measurements are the same as the samples analyzed by the Rutherford backscattering spectroscopy shown in FIG. 3.

FIGS. 5A and 5B show spectrography spectra of the imaginary part ($\varepsilon 2$) of the complex dielectric function. As a result of modeling the complex dielectric function using the Tauc-Lorentz oscillator and analyzing using a convolution method, it was found that the spectra shown by the solid lines in FIGS. 5A and 5B each can be split into the two types of components (Eg1 and Eg2) shown by broken lines.

Eg1 shown in FIGS. 5A and 5B is a spectrum caused by the large bandgap positioned on the high-energy-side. Eg2 shown in FIGS. 5A and 5B is a spectrum caused by the small bandgap positioned on the low-energy side.

For SnWO, Eg1=2.9 eV; and Eg2=0.64 eV. For SnO, Eg1=2.66 eV; and Eg2=0.52 eV. Comparing the spectra of SnWO and SnO, it can be seen that the light absorption characteristic of SnWO is greater than that of SnO even though the values of Eg1 and Eg2 are larger for SnWO than for SnO. Also, it was found that the spectrum caused by the small bandgap positioned on the low-energy side changes more steeply in SnWO than in SnO. These results show that the binding density of states of the oxide semiconductor of SnWO according to the embodiment is good compared to the oxide semiconductor of SnO not including W; and the valence band and the conduction band of the oxide semiconductor of SnWO both have high density electronic states.

Figure 6:
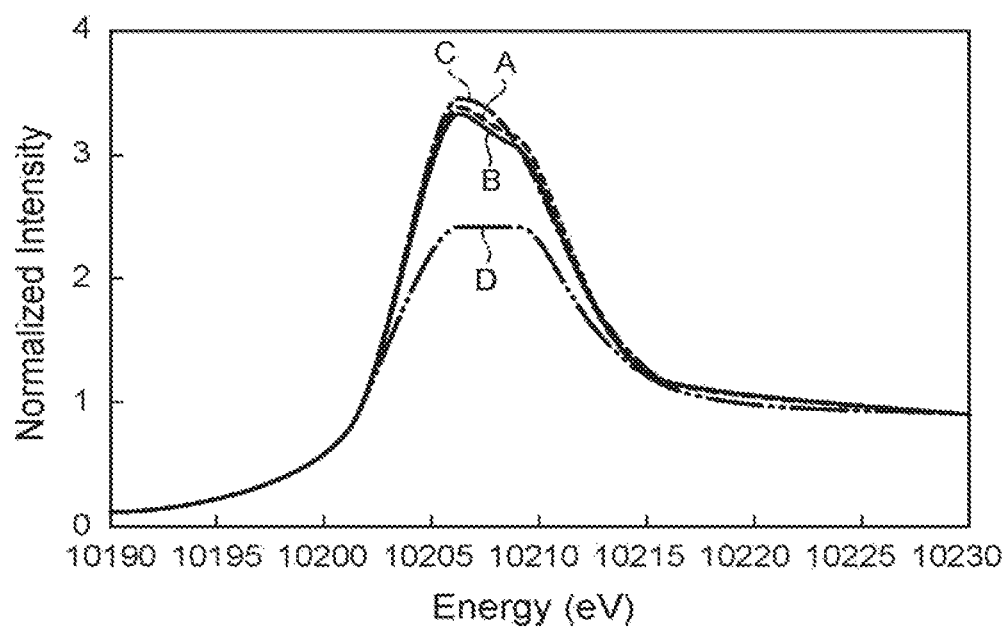
FIG. 6 is a graph showing XANES (X-ray absorption near edge structure) spectra of the W $L_3$-edge of the oxide semiconductor according to the embodiment.
Figure 7:
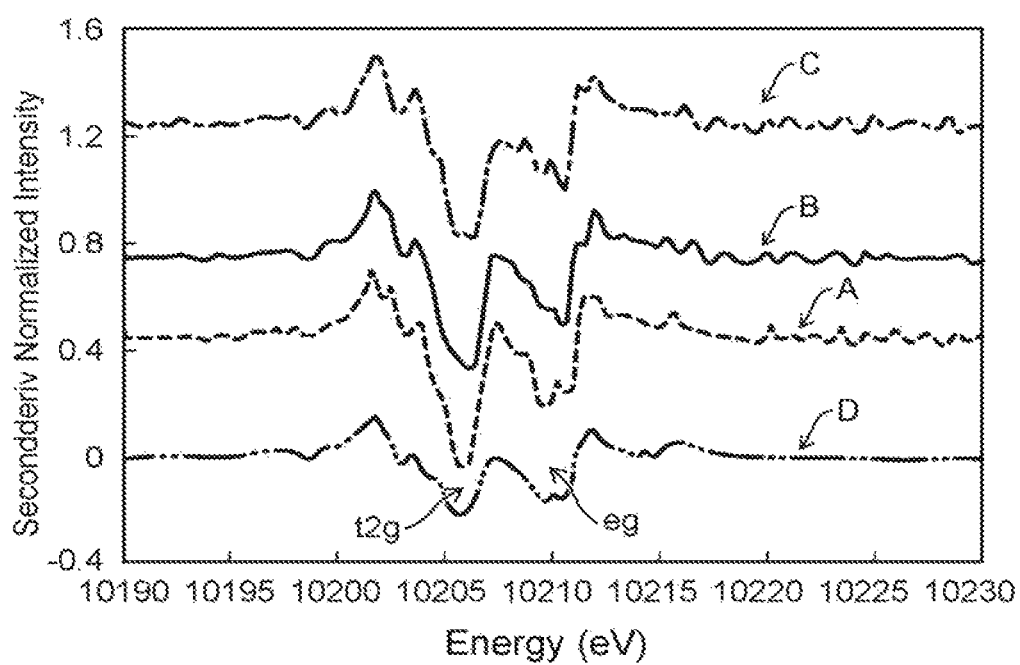
FIG. 7 is a graph showing XANES (X-ray absorption near edge structure) spectra of the W $L_3$-edge of the oxide semiconductor according to the embodiment.

FIG. 6 and FIG. 7 are graphs showing XANES (X-ray absorption near edge structure) spectra of the W $L_3$-edge of the oxide semiconductor of SnWO according to the embodiment. FIG. 6 shows the measurement results of the W $L_3$-edge of the oxide semiconductor of SnWO and tungsten trioxide (monoclinic $WO_3$). FIG. 7 is a graph showing the second derivatives spectra of FIG. 6. The graphs A to C inside FIG. 6 and FIG. 7 show the results of the oxide semiconductor of SnWO. The graph D shows the result of tungsten trioxide ($WO_3$).

The oxide semiconductor of SnWO is formed on a silicon substrate using magnetron sputtering. The sputtering target is a SnWO sintered body made using a proportion of SnO (90 wt %) and $WO_3$ (10 wt %). The sputtering is performed without substrate heating in an atmosphere including at least one of an Ar gas or an $O_2$ gas.

The graph A is the result of SnWO sputtered in an Ar gas atmosphere. The graph B is the result of SnWO sputtered in an atmosphere including an Ar gas and an $O_2$ gas in which the proportion of the $O_2$ gas is 5%. The graph C is the result of SnWO sputtered in an atmosphere including an Ar gas and an $O_2$ gas in which the proportion of the $O_2$ gas is 15%. That is, the graphs A to C show the characteristics of SnWO having different oxidation states. Here, the proportion of the $O_2$ gas is a value expressed in percent of the flow rate of the $O_2$ gas divided by the sum of the flow rate of the Ar gas and the flow rate of the $O_2$ gas ($O_2/(Ar+O_2)$). The sum of the flow rate of the Ar gas and the flow rate of the $O_2$ gas was set to a constant.

The XANES measurement and analysis of the samples was performed using a large synchrotron radiation facility (SPring-8, BL14B2). The XANES spectrum is due to the electron transition from the core orbitals to unoccupied orbitals (unoccupied levels or a quasi-continuous level), and includes information relating to the valence and the coordination structure.

As shown in FIG. 6, it can be seen that the energy position of the rise of the W $L_3$-edge is substantially the same for the graphs A to C which are the results of the oxide semiconductor of SnWO and the graph D which is the result of $WO_3$ (monoclinic tungsten trioxide). Therefore, it is estimated that the W of the oxide semiconductor of SnWO exists as hexavalent $WO_3$ (tungsten trioxide) regardless of the oxidation atmosphere when sputtering.

According to the second derivatives spectra shown in FIG. 7, it can be seen that the W 5d-orbitals of SnWO shown by the graphs A to C is split into the peak due to the $t_{2g}$-orbitals and the peak due to the $e_g$-orbitals similarly to the W 5d-orbitals of $WO_3$ shown by the graph D. Also, it can also be seen that the energy difference (the split states) between the peak due to the $t_{2g}$-orbitals and the peak due to the $e_g$-orbitals of the SnWO shown by the graphs A to C is substantially the same as the energy difference (the split states) of the $WO_3$ shown by the graph D. From this result, it is considered that the W of SnWO forms an octahedral $WO_6$ cluster regardless of the oxidation atmosphere when sputtering.

In FIG. 6 and FIG. 7, it can be seen that the absorption amount is larger for each of the graphs A to C of the oxide semiconductor of SnWO than for the graph D of $WO_3$; in particular, the sensitivity of the peak due to the $t_{2g}$-orbitals positioned at the bottom of the conduction band is large. Although the XANES spectrum of the W $L_3$-edge mainly reflects the electron transition from the $W2p_{3/2}$-orbitals to the W 5d-orbitals, the XANES spectra also shows a strong interaction between the W 5d-orbitals and the Sn 5s-orbitals in the graphs A to C of the oxide semiconductor of SnWO. It is estimated that the $t_{2g}$-orbitals of FIG. 7 are attributed to the $W5d_{xy}$-orbitals, the $W5d_{yz}$-orbitals, and the $W5d_{xz}$-orbitals; therefore, it is considered that the interaction between the Sn 5s-orbitals, the $W5d_{xy}$-orbitals, the $W5d_{yz}$-orbitals, and the $W5d_{xz}$-orbitals is in an exceedingly strong state in SnWO.

The density of states of the atomic orbitals inside the conduction band is due to the interaction between proximal atoms. The density of states at the bottom of the conduction band is an especially important indicator for arguing the electron conductivity. The oxide semiconductor of SnWO according to the embodiment includes tin monoxide (SnO) and tungsten trioxide ($WO_3$). Thereby, compared to SnO not including W, it is possible to obtain a good electronic state in the oxide semiconductor of SnWO; and the oxide semiconductor of SnWO includes high density distributed orbitals (electronic states) in both the valence band and the conduction band.

Figure 8:
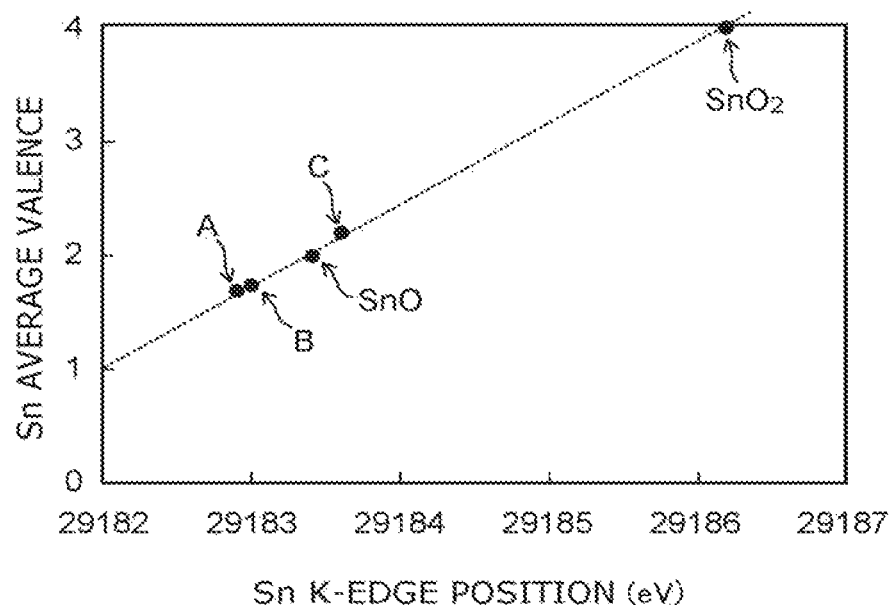
FIG. 8 is a graph showing the valence of tin (Sn) in the oxide semiconductor according to the embodiment.

FIG. 8 is a graph showing the results of the analysis of the valence of Sn in the oxide semiconductor of SnWO according to the embodiment. These results are estimated from the XANES spectrum of the Sn K-edge of the oxide semiconductor of SnWO, tin monoxide (SnO having a tetragonal tetrahedral structure), and tin dioxide ($SnO_2$ having a tetragonal rutile octahedral structure). The horizontal axis is the XANES spectrum edge position (units: eV) of the Sn K-edge. The vertical axis is the average valence of Sn.

A to C shown in FIG. 8 are the Sn average valence for the oxide semiconductor of SnWO formed on a silicon substrate by magnetron sputtering. The sputtering target is a SnWO sintered body including SnO (90 wt %) and $WO_3$ (10 wt %). The sputtering was performed without substrate heating in an atmosphere including at least one of an Ar gas or an $O_2$ gas. A shows the value of SnWO formed in an atmosphere including only Ar gas. B shows the value of SnWO formed in an atmosphere in which the proportion of the $O_2$ gas is 5%. C shows the value of SnWO formed in an atmosphere in which the proportion of the $O_2$ gas is 15%. The proportion of the $O_2$ gas is the value expressed in percent of the flow rate of the $O_2$ gas divided by the sum of the flow rate of the Ar gas and the flow rate of the $O_2$ gas ($O_2/(Ar+O_2)$). The sum of the flow rate of the Ar gas and the flow rate of the $O_2$ gas is constant.

XANES measurement and analysis was performed using a large synchrotron radiation facility (SPring-8, BL14B2). The XANES spectrum is due to the electron transition from the core orbitals to unoccupied orbitals (unoccupied levels or a quasi-continuous level), and includes information relating to the valence and the coordination structure. For tin monoxide (SnO having the tetragonal tetrahedral structure), the Sn average valence is divalent. For tin dioxide ($SnO_2$ having the tetragonal rutile octahedral structure), the Sn average valence is tetravalent.

A strong correlation is seen between the Sn average valence and the edge position of the XANES spectrum of the Sn K-edge shown in FIG. 8. Because the average valence is less than 2 for A and B of the oxide semiconductor of SnWO, it is estimated that the oxidation state of Sn is somewhat low. On the other hand, the Sn average valence of C of the oxide semiconductor of SnWO is greater than 2. Therefore, it is estimated that the oxide semiconductor of SnWO corresponding to C includes Sn having a valence greater than 2.

Thus, in the oxide semiconductor of SnWO according to the embodiment, the ratio of the flow rate of the Ar gas and the flow rate of the $O_2$ gas when sputtering can be set favorably; and Sn having the desired oxidation state can be obtained. Also, the W that is included in the oxide semiconductor of SnWO forms an octahedral $WO_6$ cluster regardless of the proportion of oxygen in the atmosphere when sputtering. Accordingly, the electronic state of the oxide semiconductor of SnWO can be controlled by favorably setting the W content ratio, i.e., the ratio of W to Sn. For example, by using the oxide semiconductor of SnWO as the channel layer of the transistor, the stability of the characteristics of the semiconductor device can be improved.

Figure 9:
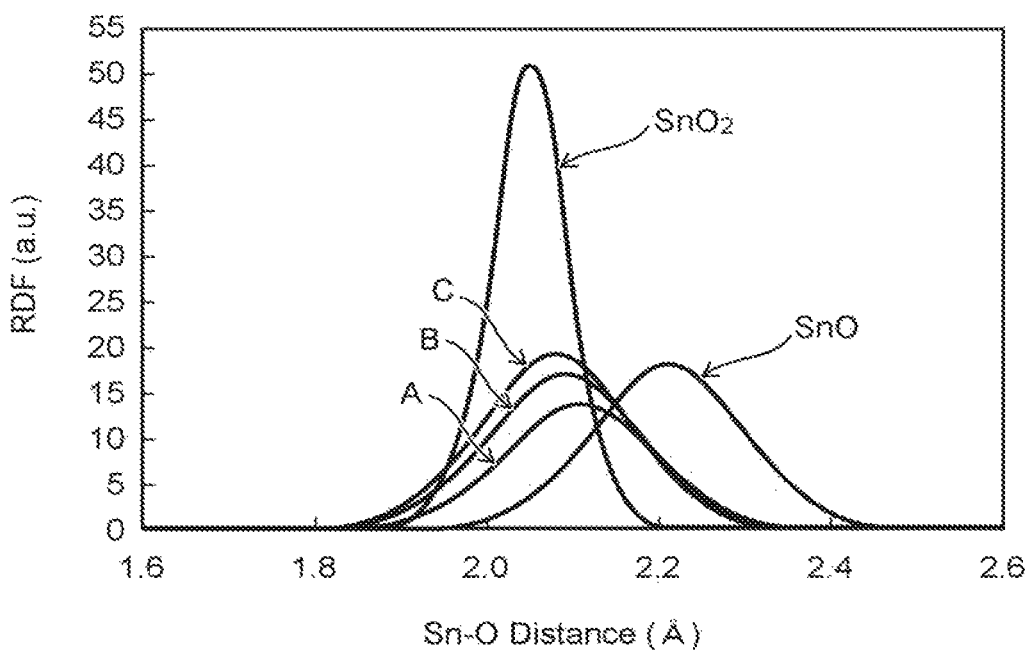
FIG. 9 is a graph showing the radial distribution function of tin (Sn) in the oxide semiconductor according to the embodiment.

FIG. 9 is a graph showing the radial distribution function of Sn in the oxide semiconductor of SnWO according to the embodiment. A to C of the figure illustrate the radial distribution functions of the oxide semiconductor of SnWO. The figure also shows the radial distribution function of tin monoxide (SnO having the tetragonal tetrahedral structure) and the radial distribution function of tin dioxide ($SnO_2$ having the tetragonal rutile octahedral structure). The graphs shown in the figure are the results determined by analyzing the EXAFS (extended X-ray absorption fine structure) spectrum of the Sn K-edge. The horizontal axis is the interatomic distance (units: Å) between Sn and O. The RDF (Radial Distribution Function) of the vertical axis illustrates the normalized existence ratio.

A to C shown in FIG. 9 are the radial distribution functions of the oxide semiconductor of SnWO formed on a silicon substrate by magnetron sputtering. The sputtering target is a SnWO sintered body including SnO (90 wt %) and $WO_3$ (10 wt %). The sputtering is performed without substrate heating in an atmosphere including at least one of an Ar gas or an $O_2$ gas. A is the radial distribution function of SnWO formed in an atmosphere of only Ar gas. B is the radial distribution function of SnWO formed in an atmosphere in which the proportion of the $O_2$ gas is 5%. C is the radial distribution function of SnWO formed in an atmosphere in which the proportion of the $O_2$ gas is 15%. The proportion of the $O_2$ gas is the value expressed in percent of the flow rate of the $O_2$ gas divided by the sum of the flow rate of the Ar gas and the flow rate of the $O_2$ gas ($O_2/(Ar+O_2)$). The sum of the flow rate of the Ar gas and the flow rate of the $O_2$ gas is constant.

The measurements of the EXAFS spectra were performed using a large synchrotron radiation facility (SPring-8, BL14B2). The EXAFS spectrum is due to the oscillation structure of the interference between the photoelectron and the scattered wave of the photoelectron or the scattering between the photoelectron and the neighboring atoms, and includes information relating to the interatomic distance and the coordination number.

For example, the nearest neighbor of the radial distribution function is due to the oxygen coordination and corresponds to the bond length between the metal atom and the oxygen atom. The peak values of the Sn—O radial distribution functions shown in FIG. 9 are A: 2.11 Å, B: 2.09 Å, C: 2.08 Å, SnO: 2.21 Å, and $SnO_2$: 2.05 Å. The radial distribution functions A to C show that the interatomic distance between the Sn atom and the O atom in the oxide semiconductor of SnWO is shorter than the interatomic distance between the Sn atom and the O atom of tin monoxide (SnO having the tetragonal tetrahedral structure) and is a value near that of tin dioxide ($SnO_2$ having the tetragonal rutile octahedral structure). This result shows that a cluster having a short bond length between the Sn atom and the O atoms is formed by adding W.

Because the ionic-bonding property of an oxide semiconductor is strong, for example, it is possible to evaluate the heat resistance (the thermal stability) using the Coulomb force. The Coulomb force is proportional to the product of the ionic valence of the metal atom and the ionic valence of the oxygen atom and to the reciprocal of the square of the interatomic distance (the bond length). Because the ionic valence of W is 6 and is large, it is predicted that a high thermal stability is obtained. On the other hand, although the ionic valence of Sn inside the oxide semiconductor of SnWO is about 2 and is small as shown in FIG. 8, according to the radial distribution functions shown in FIG. 9, it is considered that a bond that is stronger than that of SnO not including W is formed.

As described above, the oxide semiconductor of SnWO has high heat resistance because the oxide semiconductor of SnWO includes W. Accordingly, in the case where the oxide semiconductor of SnWO is used as the channel layer of the transistor, the stability of the characteristics of the semiconductor device can be improved. In the oxide semiconductor of SnWO according to the embodiment, the resistivity increases as the W content ratio is increased; and the resistivity decreases as the W content ratio is reduced. There is a correlation between the controllability of the band structure and the W content ratio. For example, for applications to the channel layer of a thin film transistor, it is desirable to set the ratio of W to Sn to a favorable range. In the oxide semiconductor of SnWO according to the embodiment, it is favorable for the content ratio of tungsten trioxide ($WO_3$) to be lower than the content ratio of tin monoxide (SnO), and for the atom number ratio (W/Sn) of W to Sn to be not less than 0.05 and not more than 0.3.

Figures 10, 11:
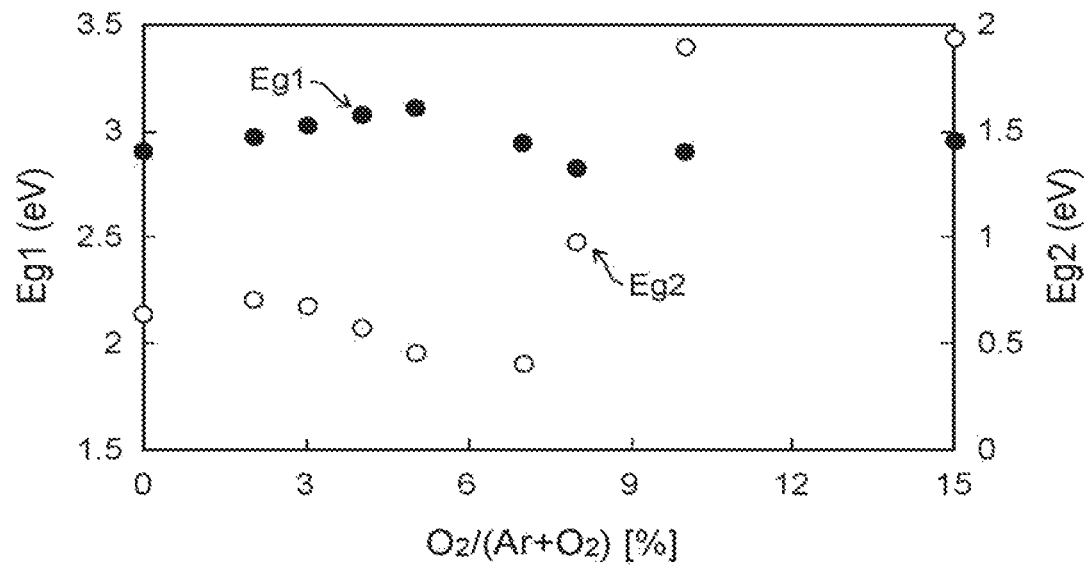
FIG. 10 is a graph showing the analysis results of the bandgap of the oxide semiconductor according to the embodiment.
FIG. 11 is a table showing the average coordination numbers of tin (Sn) and tungsten (W) for the oxide semiconductor according to the embodiment.

FIG. 10 is a graph showing the bandgap of the oxide semiconductor of SnWO according to the embodiment. The oxide semiconductor of SnWO is formed on a silicon substrate using magnetron sputtering. The sputtering target is a SnWO sintered body including SnO (90 wt %) and $WO_3$ (10 wt %). The sputtering is performed without substrate heating in an atmosphere including at least one of an Ar gas or an $O_2$ gas. The horizontal axis of FIG. 10 is the proportion of the $O_2$ gas in the atmosphere when sputtering. The proportion of the $O_2$ gas is the value expressed in percent of the flow rate of the $O_2$ gas divided by the sum of the flow rate of the Ar gas and the flow rate of the $O_2$ gas ($O_2/(Ar+O_2)$). The sum of the flow rate of the Ar gas and the flow rate of the $O_2$ gas is constant.

The vertical axis of FIG. 10 is the bandgap (the optical gap) measured using spectroscopic ellipsometry. As a result of analyzing the complex dielectric function by a convolution method, it was found that the band structure of the oxide semiconductor of SnWO according to the embodiment includes the two types of components of Eg1 and Eg2. Eg1 corresponds to a wide gap in which the absorption edge is positioned on the high-energy-side; and Eg2 corresponds to a narrow gap in which the absorption edge is positioned on the low-energy side. That is, the relationship of the energy of the bandgap is Eg2<Eg1.

As shown in FIG. 10, the value of Eg1 changes above and below 3 eV as the proportion of the $O_2$ gas is changed; but the change of Eg1 is small. On the other hand, the value of Eg2 is 0.4 eV to 0.7 eV and has a small change when the proportion of the $O_2$ gas is 8% or less; but when the proportion of the $O_2$ gas exceeds 8%, Eg2 increases steeply and has a trend of saturating at a value of about 2 eV.

FIG. 11 is a table showing the results of the analysis of the average coordination numbers of Sn and W for the oxide semiconductor of SnWO shown in FIG. 10. The EXAFS spectra for the Sn K-edge and the W $L_3$-edge are determined by measuring and analyzing. The measurement of the EXAFS spectrum was performed using a large synchrotron radiation facility (SPring-8, BL14B2). A is SnWO formed in an atmosphere of only Ar gas. B is SnWO formed in an atmosphere in which the proportion of the $O_2$ gas is 5%. C is SnWO formed in an atmosphere in which the proportion of the $O_2$ gas is 15%.

As shown in FIG. 11, the average coordination number of Sn is A: 3.1, B: 3.8, and C: 4.3 and has a positive correlation with the proportion of the $O_2$ gas when sputtering. On the other hand, the average coordination number of W is 6 for both A and C; and a change with respect to the proportion of the $O_2$ gas when sputtering is not confirmed.

The coordination numbers of tin monoxide (tetragonal SnO), tin dioxide (tetragonal rutile $SnO_2$), and tungsten trioxide (monoclinic $WO_3$) also were measured. Although not illustrated here, the results of the analysis showed the average coordination numbers to be SnO: 4, $SnO_2$: 6, and $WO_3$: 6.

For example, an oxide semiconductor is a compound of a metal and oxygen. Because there is a large electronegativity difference between a metal atom and an oxygen atom, generally, the ionic-bonding property of the oxide semiconductor is strong. By considering the metal ion to be a positively charged rigid sphere and considering the oxygen ion to be a negatively charged rigid sphere, the structure of the oxide semiconductor can be described using an ion cluster model. This is based on considering that an electrostatic interaction occurs between the ions assumed to be charged rigid spheres.

By assuming the oxide semiconductor to be an aggregate of clusters of metal atoms and oxygen atoms, the coordination structure of each cluster can be considered to be a polyhedron in which multiple oxygen atoms are coordinated around one metal atom. The possible coordination numbers of the metal atom is dependent on the unique properties of the element; and there may be many multiple types even for the same valence. Accordingly, in an amorphous multicomponent-system oxide semiconductor, electronic states of the system are determined by coupling between clusters having multiple types of coordination structures.

In the oxide semiconductor of SnWO according to the embodiment as shown in FIG. 10 and FIG. 11, it can be seen that there is a correlation between the band structure and the coordination structure of the cluster; and at least two types of electronic states exist. When the region where the proportion of the $O_2$ gas when sputtering is less than 8% is taken as a low-oxygen region and the region where the proportion of the $O_2$ gas is greater than 8% is taken as a high-oxygen region in FIG. 10, the average coordination number of Sn is less than 4 in the low-oxygen region; and it is estimated that the interaction between the Sn atoms is strong. Conversely, in the high-oxygen region, the average coordination number of Sn is greater than 4; and it is considered that the interaction between the Sn atoms is lower compared to the low-oxygen region.

On the other hand, the average coordination number of W is 6 and does not change; therefore, it is clear that W forms an octahedral $WO_6$ cluster inside SnWO. For the oxide semiconductor of SnWO according to the embodiment, it is estimated that the addition of W is effective for controlling the coordination number of Sn; and high density distributed orbitals (electronic states) are formed by ligand field splitting in both the conduction band and the valence band.

The results described above show that the energy of the narrow gap Eg2 necessary for the ambipolar operation of the thin film transistor can be optimized by controlling the interaction between the Sn atoms. In other words, in the oxide semiconductor of SnWO according to the embodiment, the coordination numbers of Sn and W are controlling factors of the band structure.

In the oxide semiconductor of SnWO according to the embodiment, both electron and hole conductivities are high; and an ambipolar operation is possible. A high-temperature tolerance also is realized. Thereby, for example, an ambipolar transistor circuit can be configured using one oxide semiconductor layer 50. In other words, a CMOS circuit can be realized using one oxide semiconductor layer 50. In other words, higher performance and higher functionality of the semiconductor device 100 can be realized inexpensively. Also, the stability of the characteristics of the semiconductor device 100 can be improved.

The embodiment is not limited to the examples recited above. For example, an oxide semiconductor that further includes at least one of tantalum (Ta), molybdenum (Mo), or niobium (Nb) in addition to tungsten (W) may be used. These transition metals have d-orbitals (Ta5d, Mo4d, and Nb4d) near the energy levels of the Sn 5s-orbitals and the Sn 5p-orbitals of tin (Sn); and the principal quantum numbers are 5 or more. Due to such reasons, effects similar to the case where tungsten (W) is added can be expected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
an oxide semiconductor layer including tin and tungsten;
a first electrode electrically connected to a first end portion of the oxide semiconductor layer;
a second electrode electrically connected to a second end portion of the oxide semiconductor layer on a side opposite to the first end portion; and
a control electrode opposing a portion of the oxide semiconductor layer between the first end portion and the second end portion, wherein
an average interatomic distance between the tin atoms and the oxygen atoms in the oxide semiconductor layer is shorter than an average interatomic distance between tin atoms and oxygen atoms in a tin monoxide crystal.

2. The device according to claim 1, further comprising an insulating film provided between the oxide semiconductor layer and the control electrode.

3. The device according to claim 1, wherein an average coordination number of oxygen atoms to tungsten atoms in the oxide semiconductor layer is 6.

4. The device according to claim 1, wherein an atom number ratio of tungsten atoms to tin atoms in the oxide semiconductor layer is 0.3 or less.

5. The device according to claim 1, wherein the oxide semiconductor layer has a conduction band in which 5s orbitals of a tin atom and 5d orbitals of a tungsten atom are hybridized, and has a valence band including hybridized orbitals of 5s orbitals of a tin atom and 5p orbitals of a tin atom.

6. The device according to claim 1, wherein the oxide semiconductor layer has a conduction band in which 5s orbitals of a tin atom and 5d orbitals of a tungsten atom are hybridized, and has a valence band including hybridized orbitals of 5d orbitals of a tungsten atom and 2p orbitals of an oxygen atom.

7. The device according to claim 1, wherein the oxide semiconductor layer has a first bandgap having a bandgap energy of 0.8 eV or less, and a second bandgap wider than the first bandgap; the first bandgap is wider than an indirect bandgap of tin monoxide; and the second band nap is wider than a direct bandgap of tin monoxide.

8. The device according to claim 1, wherein the oxide semiconductor layer has an amorphous structure.

9. The device according to claim 1, wherein the oxide semiconductor layer has a polycrystalline structure.

10. The device according to claim 1, wherein the oxide semiconductor layer is a ternary compound including tin, tungsten, and oxygen.

11. The device according to claim 1, wherein the oxide semiconductor layer includes tin monoxide and tungsten trioxide.

12. The device according to claim 11, wherein a content ratio of the tungsten trioxide is lower than a content ratio of the tin monoxide in the oxide semiconductor layer.

13. The device according to claim 11, wherein the tungsten trioxide has an octahedral W cluster structure including six oxygen atoms coordinated around a W atom.

14. The device according to claim 1, wherein the oxide semiconductor further includes at least one of tantalum (Ta), molybdenum (Mo), or niobium (Nb).

15. The device according to claim 1, wherein an average coordination number of oxygen atoms to tin atoms in the oxide semiconductor is greater than 3 but less than 4.

16. The device according to claim 1, wherein
the oxide semiconductor has $t_{2g}$-orbitals and $e_g$-orbitals due to 5d-orbitals splitting of tungsten atom and exhibits, in XANES spectrum, a first peak due to the $t_{2g}$-orbitals and a second peak due to the $e_g$-orbitals; and
the intensity ratio of the first peak to the second peak is larger than an intensity ratio in tungsten trioxide of a first peak due to $t_{2g}$-orbitals to a second peak due to $e_g$-orbitals.

17. The device according to claim 1, wherein
the oxide semiconductor has a binding density of states larger than a binding density of states in tin monoxide.

18. The device according to claim 1, wherein
the oxide semiconductor layer has a first bandgap having a bandgap energy of 0.8 eV or less, and a second bandgap wider than the first bandgap; and
the oxide semiconductor layer has a light absorption characteristic due to the first bandgap in a region of photon energy not more than 3.5 eV, the light absorption due to the first bandgap being greater than a light absorption due to an indirect gap of tin monoxide in the region of photon energy not more than 3.5 eV.

* * * * *